(12) United States Patent
Kim

(10) Patent No.: US 7,215,164 B2
(45) Date of Patent: May 8, 2007

(54) CAPACITANCE MULTIPLIER WITH ENHANCED GAIN AND LOW POWER CONSUMPTION

(75) Inventor: Jae-Wan Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 42 days.

(21) Appl. No.: 11/145,254

(22) Filed: Jun. 3, 2005

(65) Prior Publication Data

US 2005/0275438 A1    Dec. 15, 2005

(30) Foreign Application Priority Data

Jun. 14, 2004    (KR) .............. 10-2004-0043670

(51) Int. Cl.
*H03L 7/06*    (2006.01)
(52) U.S. Cl. .................. 327/147; 327/156
(58) Field of Classification Search ........ 327/147, 327/154, 156, 162, 163, 551–555; 330/253; 331/17, 25, 253, DIG. 2; 375/373–376
See application file for complete search history.

(56) References Cited

U.S. PATENT DOCUMENTS

| | | | | |
|---|---|---|---|---|
| 4,333,057 A | * | 6/1982 | Hoover | 330/253 |
| 5,712,600 A | * | 1/1998 | Kim et al. | 331/113 R |
| 5,726,599 A | | 3/1998 | Genest | 327/553 |
| 5,828,594 A | * | 10/1998 | Fujii | 365/63 |
| 6,344,772 B1 | | 2/2002 | Larsson | 327/552 |

OTHER PUBLICATIONS

Korean Patent Application No. 1019990010674 to Choi, having Publication date of Oct. 25, 2000 (w/ English Abstract page).
"Active Capacitor Multiplier in Miller-Compensated Circuits" by Rincon-Mora, IEEE Transactions on Solid-State Circuits, vol. 35, No. 1, Jan. 2000.

* cited by examiner

*Primary Examiner*—Linh My Nguyen
(74) *Attorney, Agent, or Firm*—Monica H. Choi (57) ABSTRACT

A capacitance multiplier includes a cascade of a plurality of current amplifiers with each current amplifier having a respective current gain Ki. In addition, the capacitance multiplier includes a capacitor coupled in parallel across the cascade of current amplifiers. Such a capacitance multiplier occupies a smaller area with higher capacitance gain but with low power consumption.

20 Claims, 8 Drawing Sheets

CAPACITANCE MULTIPLIER WITH ENHANCED GAIN AND LOW POWER CONSUMPTION

BACKGROUND OF THE INVENTION

This application claims priority to Korean Patent Application No. 2004-43670 filed on Jun. 14, 2004 in the Korean Intellectual Property Office, the entire contents of which are hereby incorporated by reference.

1. Field of the Invention

The present invention relates generally to a capacitance multiplier, and in particular to a capacitance multiplier with cascaded current amplifiers for enhanced capacitance gain and low power consumption.

2. Description of the Related Art

Figure 1:
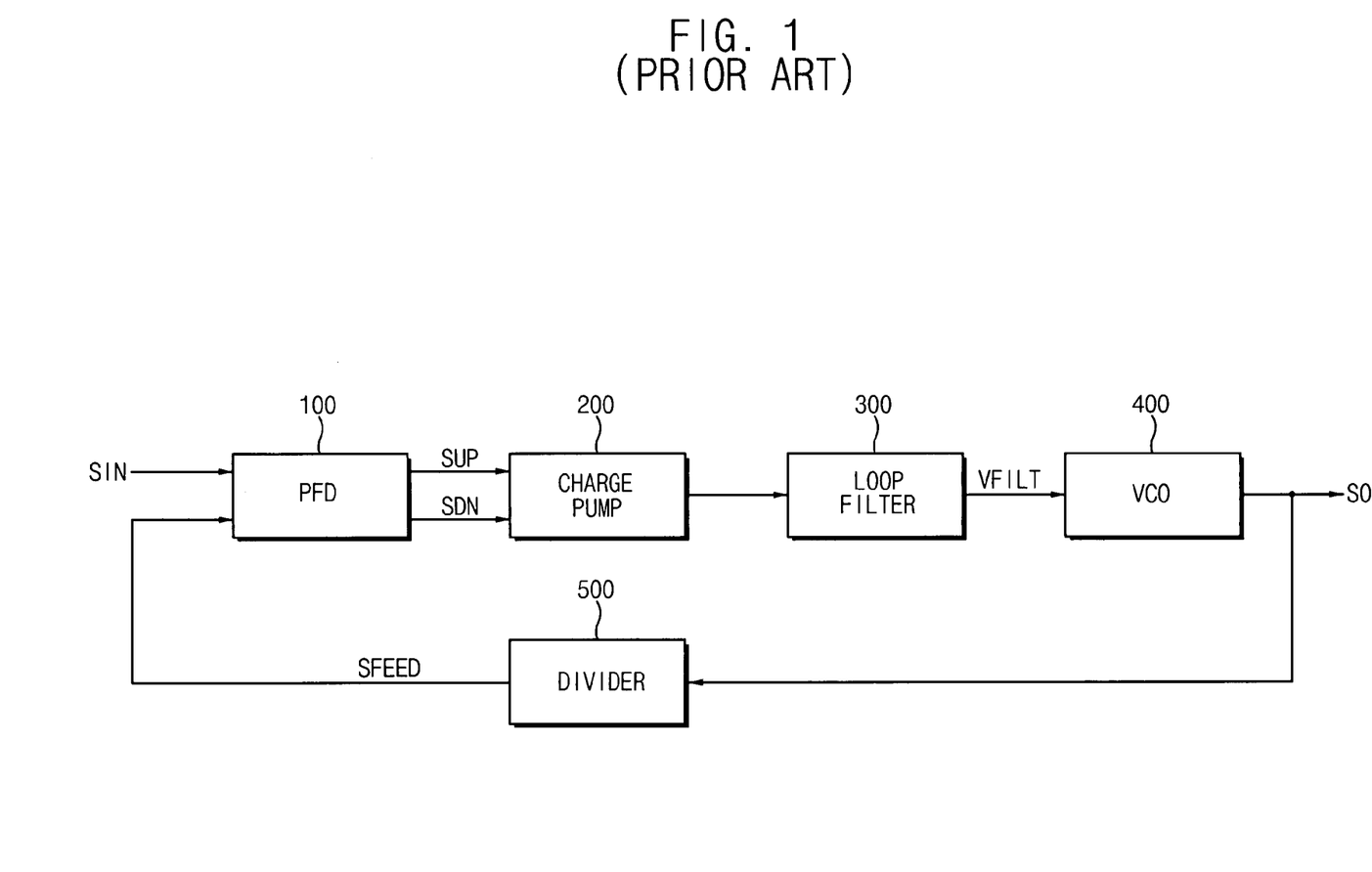
FIG. 1 shows a block diagram of a conventional PLL (Phase Locked Loop) of the prior art.

A PLL (Phase Locked Loop) is commonly used for communication, multimedia, and other applications. FIG. 1 is a block diagram of a conventional PLL (Phase Locked Loop). Referring to FIG. 1, the PLL includes a PFD (Phase Frequency Detector) 100, a charge pump 200, a loop filter 300, a VCO (voltage controlled oscillator) 400, and a frequency divider 500.

The PFD 100 generates an up signal SUP and/or a down signal SDN based on a phase (and frequency) difference between a reference signal SIN and a feedback signal SFEED. The charge pump 200 outputs an output signal having a level corresponding to a state of the up signal SUP and/or the down signal SDN.

After high frequency components of the output signal of the charge pump 200 are removed by the loop filter 300, the filtered output signal VFILT is sent to the VCO 400. The VCO 400 outputs a high frequency signal SO having a frequency corresponding to a direct current (DC) level of the signal VFILT.

The divider 500 generates a low frequency feedback signal SFEED based on the output signal SO from the VCO 400. The feedback signal SFEED is fed back to the PFD 100. When the PLL is locked, the output signal SO of the VCO 400 is used for synchronizing the phase of signals in various parts of a circuit.

Figure 2:
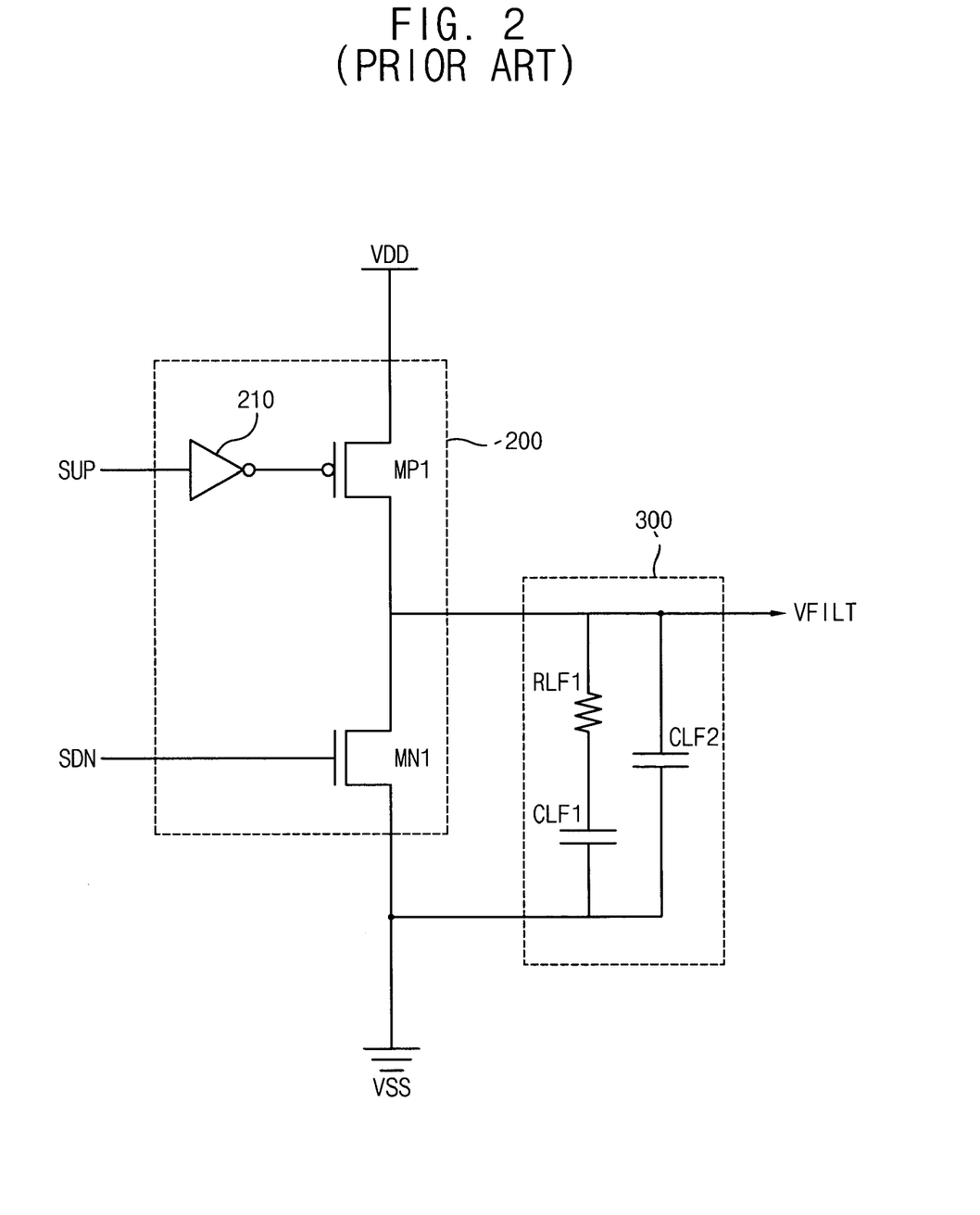
FIG. 2 shows a circuit diagram of a charge pump and a loop filter in the PLL of FIG. 1, according to the prior art.

FIG. 2 shows a circuit diagram of the charge pump 200 and the loop filter 300 in the PLL of FIG. 1. Referring to FIG. 2, the charge pump 200 includes an inverter 210 for inverting the up signal SUP, a PMOSFET (P-channel metal oxide semiconductor field effect transistor) MP1 having a source coupled to a high power supply VDD, a gate coupled to an output of the inverter 210, and a drain having the signal VFILT generated thereon. The charge pump 200 also includes an NMOSFET (N-channel metal oxide semiconductor field effect transistor) MN1 having a drain coupled to the drain of the PMOSFET MP1, a gate having the down signal SDN applied thereon, and a source coupled to a low power supply VSS. The low power supply VSS may have a negative voltage or a ground voltage.

The loop filter 300 includes a resistor RLF1 having one end coupled to the drain of the NMOSFET MN1, a first capacitor CLF1 coupled between the other end of the resistor RLF1 and the low power supply VSS, and a second capacitor CLF2 coupled between the drain of the NMOSFET MN1 and the low power supply VSS. When the loop filter 300 is implemented within a semiconductor chip, the first capacitor CLF1 disadvantageously occupies a large area. Thus, it is desired to reduce the size of the first capacitor CLF1.

Figure 3:
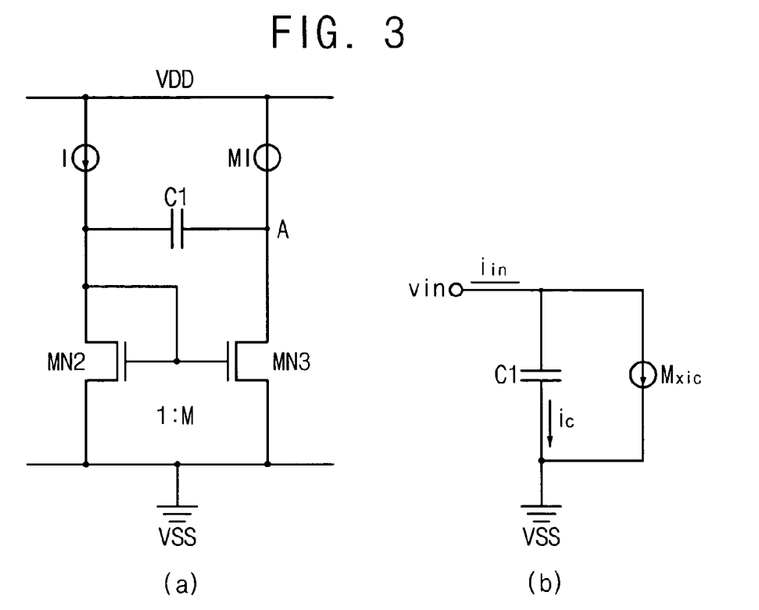
FIG. 3 shows a circuit diagram illustrating a basic principle of a capacitance multiplier; according to the prior art.

FIG. 3 shows a circuit diagram illustrating a basic principle of a capacitance multiplier. Referring to FIG. 3, (a) is a circuit diagram of a capacitance multiplier, and (b) is an AC equivalent circuit of the circuit of (a) seen from a node A.

In the circuit of (a), NMOSFETs MN2 and MN3 form a current mirror with a ratio of sizes (Width/Length) of the NMOSFETs MN2 and MN3 being 1:M. A current flowing through the capacitor C1 is substantially the current I flowing through the NMOSFET MN2, and a current flowing through a drain of the NMOSFET MN3 is M times the current I flowing through the NMOSFET MN2.

An input impedance at the node A is represented by the following expression 1:

$$Z = \frac{vin}{iin} = \frac{1}{sC1(1+M)} \qquad \langle\text{Expression 1}\rangle$$

Accordingly, an input capacitance at the node A is (1+M)C1 that is scaled up by a scale factor of M.

Figure 4:
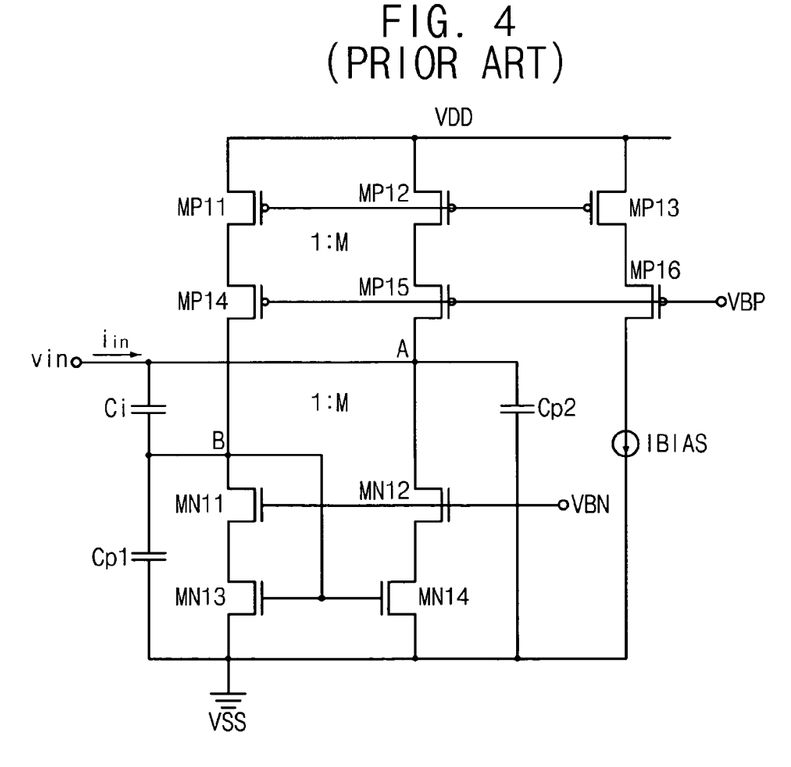
FIG. 4 shows a circuit diagram of a conventional capacitance multiplier of the prior art.

FIG. 4 is a circuit diagram of a conventional capacitance multiplier as disclosed in IEEE Journal of Solid-State Circuits, titled "A 2.4 GHz Monolithic Fractional-N Frequency Synthesizer With Robust Phase Switching Prescaler and Loop Capacitance Multiplier". An input admittance of the circuit of FIG. 4 is represented by the following expression 2:

$$Y = \frac{iin}{vin} = g_{OA} + s\left(Cp2 + (M+1)Ci\frac{1+s\frac{Cp1}{(M+1)gm1}}{1+s\frac{Ci+Cp1}{gm1}}\right) \qquad \langle\text{Expression 2}\rangle$$

In the expression 2, Cp1 and Cp2 are the capacitances of parasitic capacitors at the nodes A and B, respectively, and gm1 denotes a transconductance of the NMOSFET MN13. $g_{OA}$ denotes a total conductance at the node A, and M denotes a current gain of a current mirror.

Figure 5A:
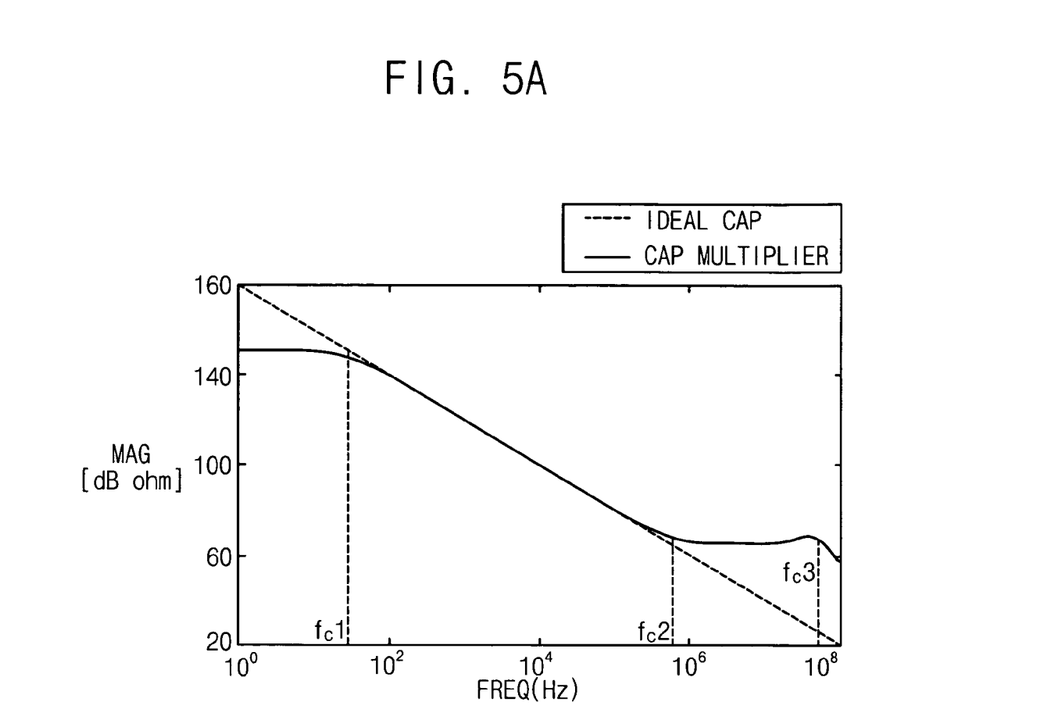
FIGS. 5A and 5B show graphs of a frequency response of an input impedance for the circuit of FIG. 4.
Figure 5B:
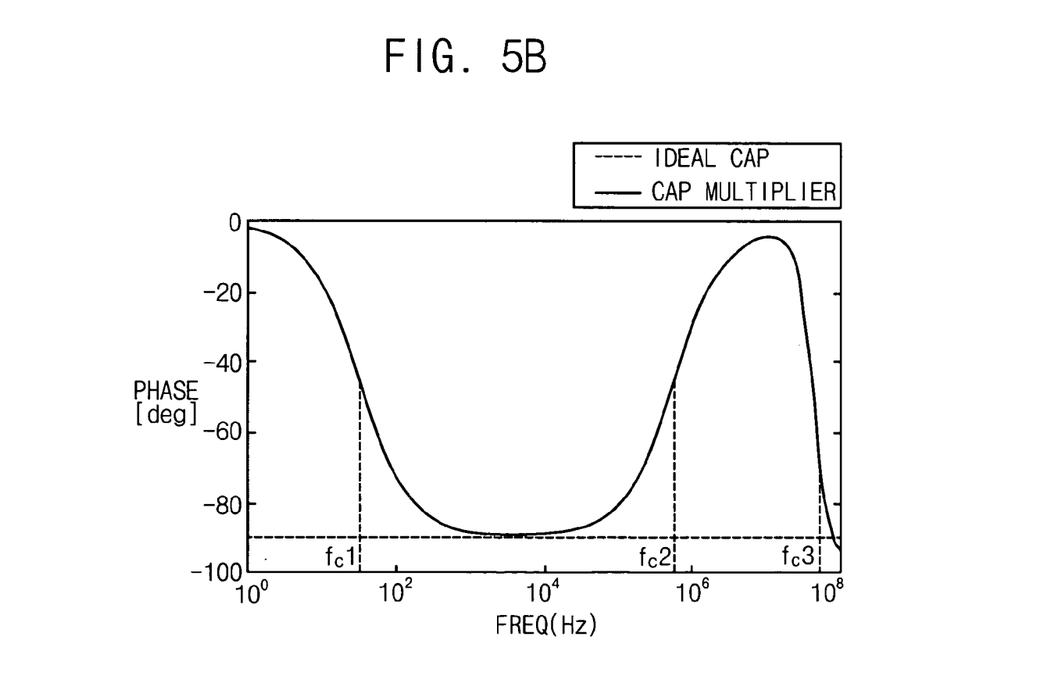

FIGS. 5A and 5B are graphs showing a frequency response of the input impedance of the circuit of FIG. 4. FIG. 5A shows a magnitude of the input impedance of the circuit of FIG. 4, and FIG. 5B shows a phase of the input impedance of the circuit of FIG. 4. Dotted lines in FIGS. 5A and 5B represent graphs illustrating an ideal frequency response.

Referring to FIGS. 5A and 5B, the circuit of FIG. 4 may be used as a capacitance multiplier in the range of a frequency greater than fc1 and a frequency less than fc2. The fc1 and fc2 are represented by the following expression 3:

$$fc1 = \frac{g_{OA}}{2\pi(M+1)Ci}, \quad fc2 = \frac{gm1}{2\pi Ci} \qquad \langle\text{Expression 3}\rangle$$

fc1 is designed to be as small as possible for preventing a decrease in the DC gain of the PLL. In particular, $g_{OA}$ is desired to be small.

In order to maintain a phase margin of the PLL, fc2 is desired to be larger than a zero frequency of the loop filter. Therefore, the value of gm1 and thus the level of current flowing through the NMOSFET MN13 are determined depending on an operating frequency of the loop filter.

For obtaining a large capacitance gain in the circuit of FIG. 4 with a large scale factor (M), the NMOSFET MN14 has current that is M times a current flowing through the NMOSFET MN13. Accordingly, the power consumption of the capacitance multiplier of FIG. 4 increases with the scale factor M. Thus, the scale factor (M) is limited to about 20 in an actual application for acceptable power consumption.

Thus, a capacitance multiplier is desired with higher capacitance gain but with low power consumption.

SUMMARY OF THE INVENTION

Accordingly, a capacitance multiplier of the present invention occupies a smaller area with higher capacitance gain but with low power consumption.

In a general aspect of the present invention, a capacitance multiplier includes a cascade of a plurality of current amplifiers with each current amplifier having a respective current gain Ki. In addition, the capacitance multiplier includes a capacitor coupled in parallel across the cascade of current amplifiers.

In one embodiment of the present invention, each current amplifier is comprised of at least one current mirror transistor pair having a size ratio of 1:Ki. In another embodiment of the present invention, each current amplifier is comprised of transistors coupled as a plurality of inverters.

In an example embodiment of the present invention, each current amplifier includes a first PMOSFET (P-channel metal oxide semiconductor field effect transistor) having a source coupled to a high power supply, and a gate and a drain coupled together to a first node. In addition, a first NMOSFET (N-channel metal oxide semiconductor field effect transistor) has a source coupled to a low power supply, and a gate and a drain coupled together to the first node. Furthermore, a second PMOSFET has a source coupled to the high power supply and a gate coupled to the first node. Additionally, a second NMOSFET has a drain coupled to a drain of the second PMOSFET, a gate coupled to the first node, and a source coupled to the low power supply. In that case, a size of the second PMOSFET is Ki times a size of the first PMOSFET, and a size of the second NMOSFET is Ki times a size of the first NMOSFET.

In another embodiment of the present invention, each current amplifier is comprised of a plurality of cascoded transistors. In an example embodiment of the present invention, each current amplifier includes a first PMOSFET having a source coupled to a high power supply, a gate coupled to a first node, and a drain coupled to a second node. In addition, a second PMOSFET has a source coupled to the high power supply and a gate coupled to the first node. Furthermore, a third PMOSFET has a source coupled to the second node and a gate coupled to a third node. Additionally, a fourth PMOSFET has a source coupled to a drain of the second PMOSFET and a gate coupled to the third node.

Also, a first NMOSFET (N-channel metal oxide semiconductor field effect transistor) has a drain coupled to a drain of the third PMOSFET, a gate coupled to the second node, and a source coupled to the third node. Furthermore, a second NMOSFET has a drain coupled to a drain of the fourth PMOSFET and a gate coupled to the second node. In addition, a third NMOSFET has a drain coupled to the third node, a gate coupled to the first node, and a source coupled to a low power supply. Furthermore, a fourth NMOSFET has a drain coupled to a source of the second NMOSFET, a gate coupled to the first node, and a source coupled to the low power supply.

In that case, a size of the second PMOSFET is Ki times a size of the first PMOSFET, a size of the fourth PMOSFET is Ki times a size of the third PMOSFET, a size of the second NMOSFET is Ki times a size of the first NMOSFET, and a size of the fourth NMOSFET is Ki times a size of the third NMOSFET.

In this manner, a capacitance gain of the capacitance multiplier is substantially a product of the respective current gains of the current amplifiers. Additionally, a total current dissipation of the capacitance multiplier is substantially a sum of currents flowing through each branch in the current amplifiers. Thus, the capacitance gain of the capacitance multiplier is increased with low power consumption. With such increased capacitance gain, the capacitance of the capacitor used in the capacitance multiplier may be reduced for decreased area.

The capacitance multiplier of the present invention is used to particular advantage within a loop filter of a phase locked loop. In that case, the capacitor has a node coupled to a charge pump of the phase locked loop.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, 6, 7, 8, 9, and 10 refer to elements having similar structure and/or function.

DETAILED DESCRIPTION OF THE INVENTION

Figure 6:
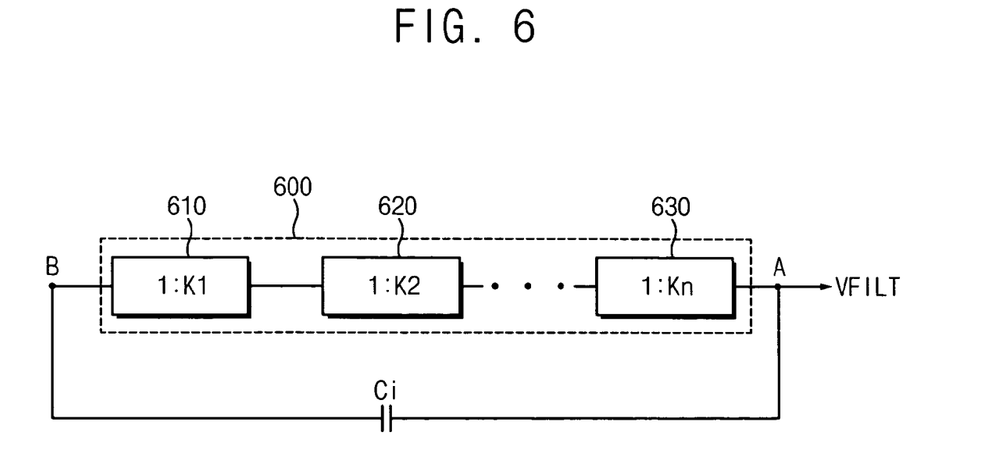
FIG. 6 shows a block diagram of a capacitance multiplier, according to an embodiment of the present invention.

FIG. 6 shows a block diagram of a capacitance multiplier according to an embodiment of the present invention. Referring to FIG. 6, the capacitance multiplier includes a current amplifying circuit 600 and a capacitor Ci. The current amplifying circuit 600 includes a plurality of current amplifiers such as first, second, and nth current amplifiers 610, 620, . . . , and 630.

The current amplifiers 610, 620, . . . , and 630 are cascaded in series, and each of the current amplifiers 610, 620, ..., and 630 has a respective current gain K1, K2, ..., Kn. In addition, the capacitor Ci is coupled in parallel across the cascade of the current amplifiers 610, 620, ..., and 630.

Figure 7:
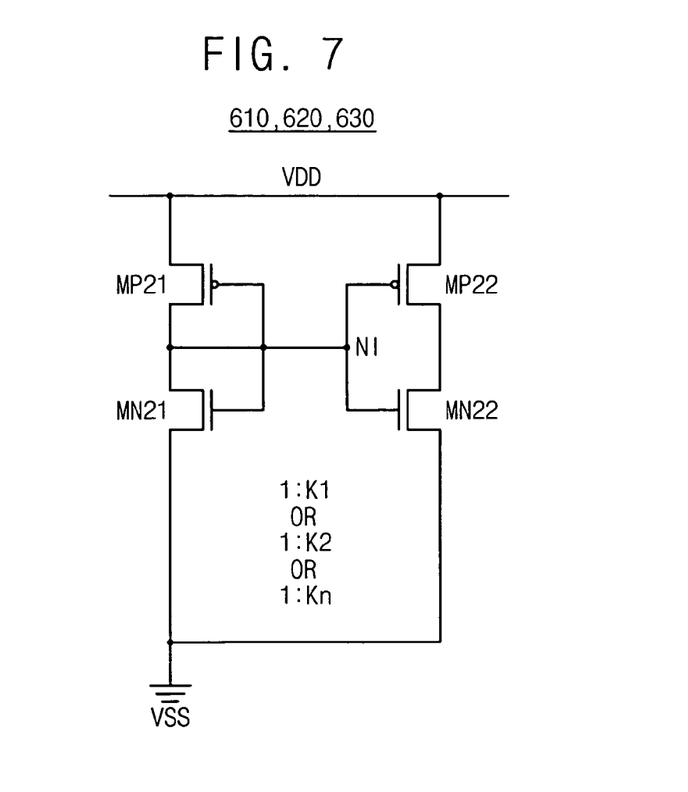
FIG. 7 shows a circuit diagram of a current amplifier included in the capacitance multiplier of FIG. 6, according to an embodiment of the present invention.

FIG. 7 shows a circuit diagram of a current amplifier included in the capacitance multiplier of FIG. 6 according to an exemplary embodiment of the present invention. Referring to FIG. 7, the current amplifier includes PMOSFETs (P-channel metal oxide semiconductor field effect transistors) MP21 and MP22, and NMOSFETs (N-channel metal oxide semiconductor field effect transistors) MN21 and MN22.

The PMOSFET MP21 has a source coupled to a high power supply VDD, and a gate and a drain coupled together at a node N1. The NMOSFET MN21 has a gate and a drain coupled together at the node N1, and a source coupled to a low power supply VSS. For example, the low power supply VSS has a ground voltage or a negative voltage.

The PMOSFET MP22 has a source coupled to the high power supply VDD and a gate coupled to the node N1. The NMOSFET MN22 has a drain coupled to the drain of the PMOSFET MP22, a gate coupled to the node N1, and a source coupled to the low power supply VSS.

Figure 10:
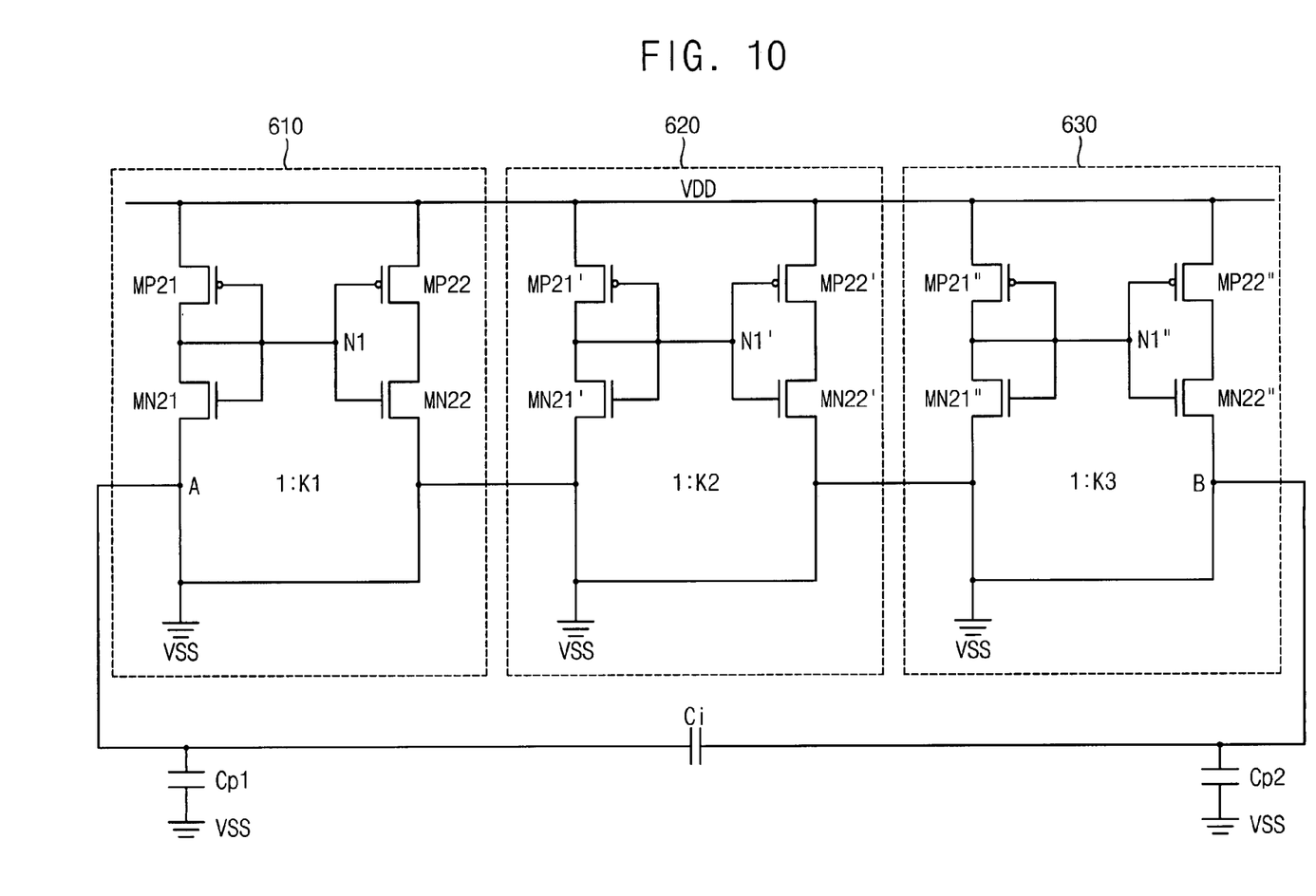
FIG. 10 shows a circuit diagram of an example capacitance multiplier of FIG. 6 with a cascade of three current amplifiers, according to an example embodiment of the present invention.

The operation of the capacitance multiplier is now explained with reference to the embodiments of FIGS. 6, 7, and 10. FIG. 10 shows an example implementation of the capacitance multiplier of FIG. 6 with each of three current amplifiers 610, 620 and 630 being implemented similarly to the current amplifier of FIG. 7. Referring to FIG. 10, each of the current amplifiers 610, 620 and 630 has a respective current gain K1, K2, and K3.

For example in FIG. 7, NMOSFETs MN21 and MN22 form a current mirror, and PMOSFETs MP21 and MP22 form a current mirror. Additionally, transistors MP21 and MN21 are configured as an inverter, and transistors MP22 and MN22 are configured as another inverter. For a current gain of Ki in FIG. 7, a size (Width/Length) of the PMOSFET MP22 is Ki times a size of the PMOSFET MP21. In addition, a size of the NMOSFET MN22 is Ki times a size of the NMOSFET MN21.

The capacitance multiplier of FIGS. 6 and 10 is suitable for lower voltage applications since each of the amplifiers 610, 620, and 630 is configured as inverters. Each of the amplifiers 610, 620, and 630 includes two inverters since an AC amplified current having an inverted phase may be fed-back when only one inverter is used in each of the amplifiers 610, 620, and 630.

In the capacitance multiplier of FIG. 10 with three amplifiers, the input admittance is represented by the following expression 4 with reference to the expression 2:

$$Y = \frac{iin}{vin} = g_{OA} + s\left(Cp2 + (K1K2K3+1)Ci\frac{1+s\frac{Cp1}{(K1K2K3+1)gm1}}{1+s\frac{Ci+Cp1}{gm1}}\right)$$ ⟨Expression 4⟩

In the expression 4, Cp1 and Cp2 denote capacitances of parasitic capacitors at nodes A and B, respectively (as illustrated in FIG. 10)

gm1 denotes a sum of the transconductance of the transistor MN21 and the transconductance of the transistor MP21. $g_{OA}$ denotes a total conductance at the node A. K1, K2, and K3 denote gains of each of the current amplifiers 610, 620, and 630, respectively. Each current gain is determined by a ratio of transistor sizes within the current amplifier.

Referring to the frequency response of FIGS. 5A and 5B, fc1 and fc2 of the capacitance multiplier in FIG. 10 are represented by the following expression 5:

$$fc1 = \frac{g_{OA}}{2\pi(K1K2K3+1)Ci}, \quad fc2 = \frac{gm1}{2\pi Ci}$$ ⟨Expression 5⟩

An operable frequency range of the frequency multiplier according to an exemplary embodiment shown in FIG. 10 has a similar range compared with that of a conventional circuit of FIG. 4.

In this manner, the frequency multiplier of FIG. 10 has a capacitance gain with a scale factor that is a product of the gains of the current amplifiers (i.e., K1K2K3). Thus, a relatively large capacitance is obtained by cascading the plurality of current amplifiers 610, 620, and 630. With such a large capacitance gain, the capacitance of the capacitor Ci may be reduced for smaller area of the capacitance multiplier. For example, the capacitor Ci is easily scaled up by 100 times.

On the other hand, the current dissipation in the capacitance multiplier of FIGS. 6 and 10 is relatively low. For example, in the conventional capacitance multiplier of FIG. 4, the circuit has an entire current of (M+1)×I=101×I with the scale factor M being 100 and with a current I flowing through the MNOSMFET MN13 in FIG. 4.

In contrast, in the capacitance multiplier of FIG. 10, when the current gains of the current amplifiers 610, 620, and 630 are K1=2, K2=5, and K3=10, the capacitance multiplier has a scale factor K1×K2×K3=100. However, the current consumed in the capacitance multiplier of FIG. 10 is (K1+K2+K3+3)×I=20×I, which is about ⅕ of the current consumed in the conventional circuit of FIG. 4. Alternatively, when K1=4, K2=5, and K3=5, the scale factor K1×K2×K3 is 100, and the current consumption is just 17×I.

Figure 8:
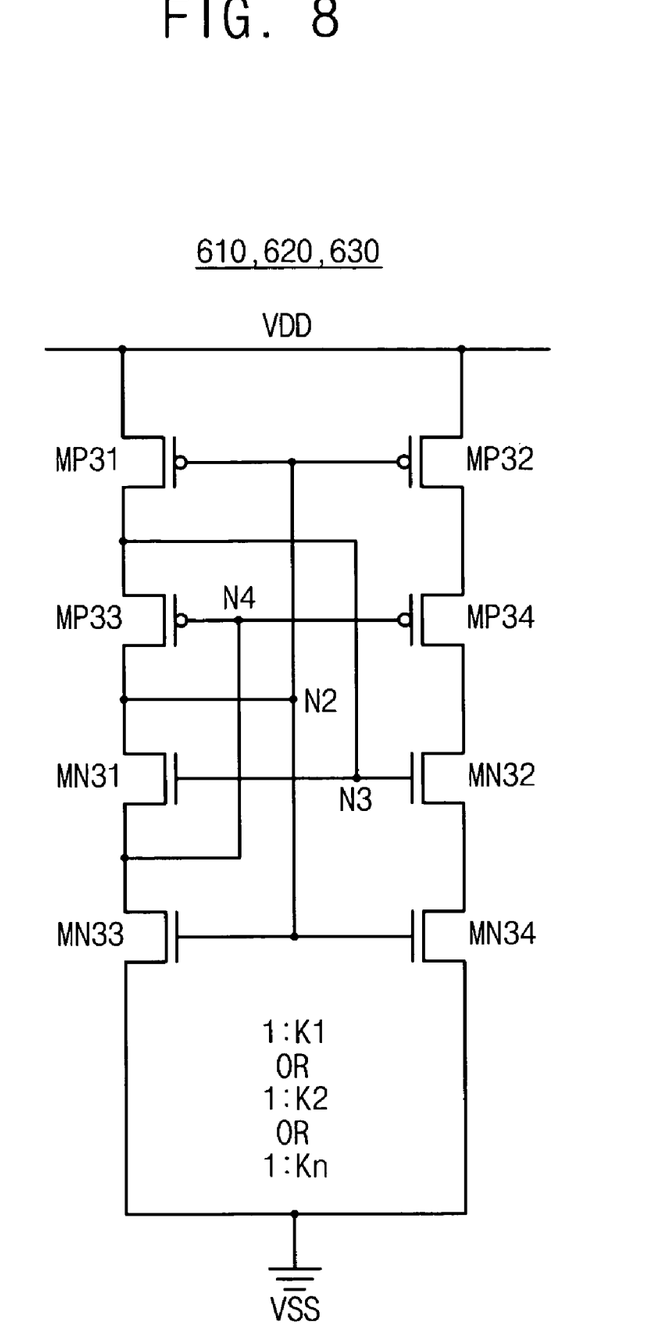
FIG. 8 shows a circuit diagram of a current amplifier included in the capacitance multiplier of FIG. 6, according to another embodiment of the present invention.

FIG. 8 shows a circuit diagram of a current amplifier included in the capacitance multiplier of FIG. 6 according to another exemplary embodiment of the present invention. The current amplifier of FIG. 8 includes a plurality of cascoded transistors for improved DC characteristic of the PLL having the capacitance multiplier.

Referring to FIG. 8, the current amplifier includes PMOSFETs MP31, MP32, MP33 and MP34, and NMOSFETs MN31, MN32, MN33 and MN34. The PMOSFETs MP31 and MP33 form a cascode of transistors, and the PMOSFETs MP32 and MP34 form a cascode of transistors. The NMOSFETs MN31 and MN33 form a cascode of transistors, and the NMOSFETs MN32 and MN34 form a cascode of transistors.

The PMOSFET MP31 has a source coupled to a high power supply VDD, a gate coupled to a node N2, and a drain coupled to a node N3. The PMOSFET MP33 has a source coupled to a node N3, a drain coupled a node N2, and a gate coupled to a node N4.

The NMOSFET MN31 has a drain coupled to the node N2, a gate coupled to the node N3, and a source coupled to the node N4. The NMOSFET MN33 has a drain coupled to the node N4, a gate coupled to the node N2, and a source coupled to a low power supply VSS.

The PMOSFET MP32 has a source coupled to the high power supply VDD and a gate coupled to the node N2. The PMOSFET MP34 has a source coupled to the drain of the PMOSFET MP32 and a gate coupled to the node N4. The NMOSFET MN32 has a drain coupled to the drain of the PMOSFET MP34 and a gate coupled to the node N3. The NMOSFET MN34 has a drain coupled to the source of the NMOSFET MN32, a gate coupled to the node N2, and a source coupled to the low power supply VSS.

For a current gain of Ki in FIG. 8, a size of the PMOSFET MP33 is Ki times a size of the PMOSFET MP31, a size of the PMOSFET MP34 is Ki times a size of the PMOSFET MP32. In addition, a size of the NMOSFET MN33 is Ki times a size of the NMOSFET MN31, and a size of the NMOSFET MN34 is Ki times a size of the NMOSFET MN32. The circuit of FIG. 8 is self-biasing and does not need a bias circuit. Operation of the circuit in FIG. 8 is similar to the operation of the current amplifier in FIG. 7, and thus a description of the operation of the circuit in FIG. 8 is omitted.

Figure 9:
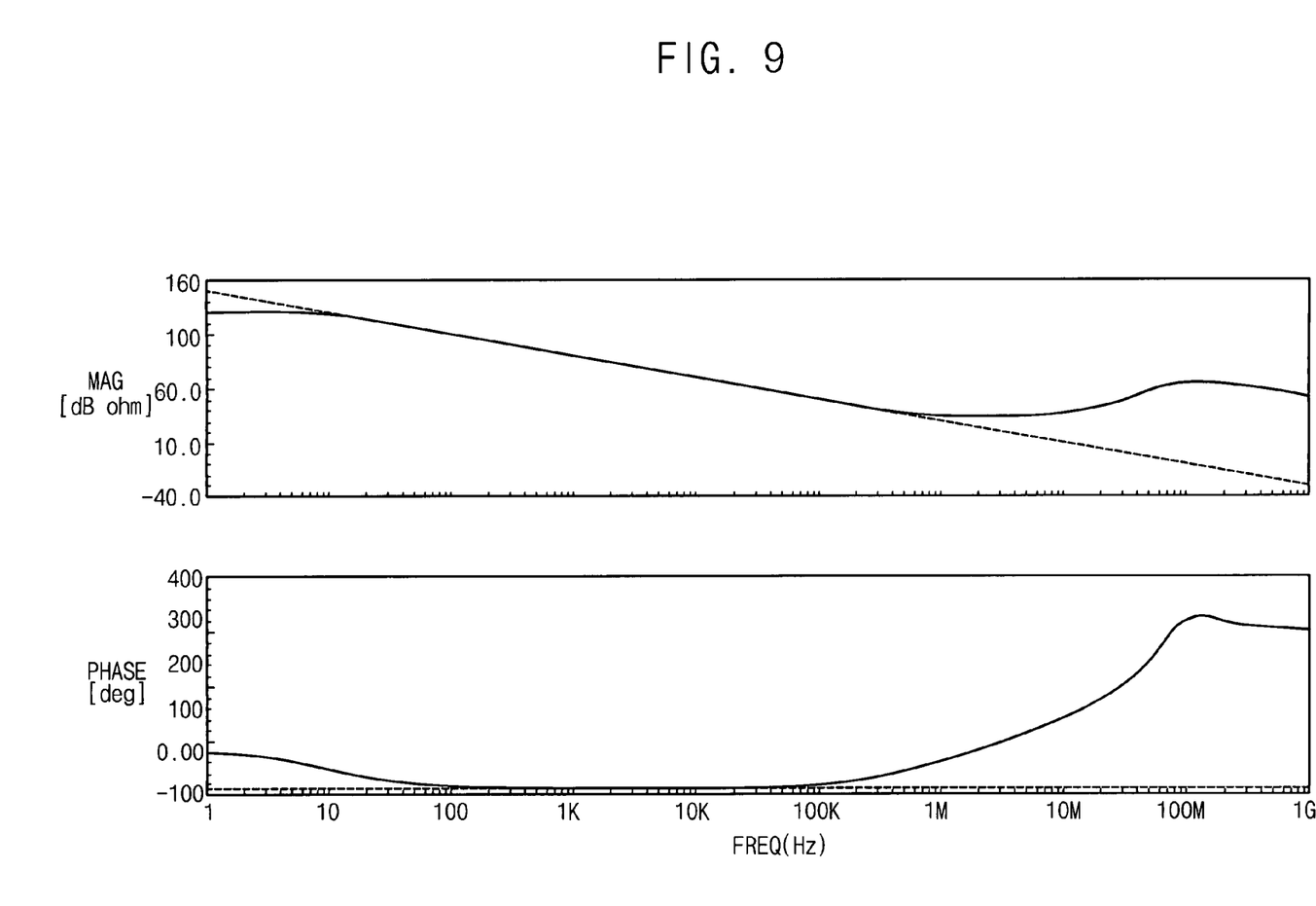
FIG. 9 shows a simulation graph of a frequency response of an input impedance of the capacitance multiplier of FIG. 10.

FIG. 9 is a simulation graph illustrating a frequency response of the input impedance of the capacitance multiplier of FIG. 10. In order to implement a capacitance of 4.7 nF during simulation, Ci is set to 33.57 pF, K1=2, K2=5, and K3=14. The dotted line of FIG. 9 represents an ideal frequency characteristic of the input impedance of the capacitance multiplier of FIG. 10, and the solid line represents the frequency characteristic of the input impedance for the capacitance multiplier of FIG. 10.

While the present invention has been particularly shown and described with reference to exemplary embodiments thereof, it will be understood by those of ordinary skill in the art that various changes in form and details may be made therein without departing from the spirit and scope of the present invention as defined by the following claims. For example, any numbers of elements or any circuit topologies as illustrated and described herein are by way of example only.

The capacitance multiplier of FIG. 6 may be advantageously used within a loop filter of a phase locked loop. In that case, one node of the capacitor Ci is coupled to a charge pump of the phase locked loop. However, the capacitance multiplier of the present invention may also be used in any other applications requiring a large capacitance with reduced area and low power consumption.

What is claimed is:

1. A capacitance multiplier comprising:
   a cascade of a plurality of current amplifiers, each current amplifier having a respective current gain Ki; and
   a capacitor coupled in parallel across the cascade of current amplifiers,
   wherein a first terminal of the capacitor is coupled to a first drain-to-source current path of a first current amplifier of the cascade of current amplifiers,
   and wherein a second terminal of the capacitor is coupled to a second drain-to-source current path of a last current amplifier of the cascade of current amplifiers.

2. The capacitance multiplier of claim 1, wherein each current amplifier is comprised of a current mirror transistor pair having a size ratio of 1:Ki, and wherein the first terminal of the capacitor is coupled to a first source terminal of a first field effect transistor of the first current amplifier, and wherein the second terminal of the capacitor is coupled to a second source terminal of a second field effect transistor of the last current amplifier.

3. The capacitance multiplier of claim 1, wherein each current amplifier is comprised of transistors coupled as a plurality of inverters.

4. The capacitance multiplier of claim 1, wherein each current amplifier is comprised of:
   a first PMOSFET (P-channel metal oxide semiconductor field effect transistor) having a source coupled to a high power supply, and a gate and a drain coupled together to a first node;
   a first NMOSFET (N-channel metal oxide semiconductor field effect transistor) having a source coupled to a low power supply, and a gate and drain coupled together to the first node;
   a second PMOSFET having a source coupled to the high power supply and a gate coupled to the first node; and
   a second NMOSFET having a drain coupled to a drain of the second PMOSFET, a gate coupled to the first node, and a source coupled to the low power supply.

5. The capacitance multiplier of claim 4, wherein a size of the second PMOSFET is Ki times a size of the first PMOSFET, and wherein a size of the second NMOSFET is Ki times a size of the first NMOSFET.

6. The capacitance multiplier of claim 1, wherein each current amplifier is comprised of a plurality of cascoded transistors.

7. The capacitance multiplier of claim 6, wherein each current amplifier is comprised of:
   a first PMOSFET (P-channel metal oxide semiconductor field effect transistor) having a source coupled to a high power supply, a gate coupled to a first node, and a drain coupled to a second node;
   a second PMOSFET having a source coupled to the high power supply and a gate coupled to the first node;
   a third PMOSFET having a source coupled to the second node and a gate coupled to a third node;
   a fourth PMOSFET having a source coupled to a drain of the second PMOSFET and a gate coupled to the third node;
   a first NMOSFET (N-channel metal oxide semiconductor field effect transistor) having a drain coupled to a drain of the third PMOSFET, a gate coupled to the second node, and a source coupled to the third node;
   a second NMOSFET having a drain coupled to a drain of the fourth PMOSFET and a gate coupled to the second node;
   a third NMOSFET having a drain coupled to the third node, a gate coupled to the first node, and a source coupled to a low power supply; and
   a fourth NMOSFET having a drain coupled to a source of the second NMOSFET, a gate coupled to the first node, and a source coupled to the low power supply.

8. The capacitance multiplier of claim 7, wherein a size of the second PMOSFET is Ki times a size of the first PMOSFET, a size of the fourth PMOSFET is Ki times a size of the third PMOSFET, a size of the second NMOSFET is Ki times a size of the first NMOSFET, and a size of the fourth NMOSFET is Ki times a size of the third NMOSFET.

9. The capacitance multiplier of claim 1, wherein a capacitance gain of the capacitance multiplier is substantially a product of the respective current gains of the current amplifiers.

10. The capacitance multiplier of claim 1, wherein a total current dissipation of the capacitance multiplier is substantially a sum of currents flowing through each branch in the current amplifiers.

11. The capacitance multiplier of claim 1, wherein the cascade of current amplifiers is comprised of three current amplifiers.

12. A capacitance multiplier comprising:
a capacitor; and
means for providing a capacitance gain that is substantially a product of a respective current gain Ki for each of a cascade of a plurality of current amplifiers,
wherein a first terminal of the capacitor is coupled to a first drain-to-source current path of a first current amplifier of the cascade of current amplifiers,
and wherein a second terminal of the capacitor is coupled to a second drain-to-source current path of a last current amplifier of the cascade of current amplifiers.

13. The capacitance multiplier of claim 12, further comprising:
means for having a total current dissipation that is substantially a sum of currents flowing through each branch in the current amplifiers.

14. The capacitance multiplier of claim 12, wherein each current amplifier is comprised of a current mirror transistor pair having a size ratio of 1:Ki, and wherein the first terminal of the capacitor is coupled to a first source terminal of a first field effect transistor of the first current amplifier, and wherein the second terminal of the capacitor is coupled to a second source terminal of a second field effect transistor of the last current amplifier.

15. A phase locked loop comprising:
a charge pump; and
a loop filter having a capacitance multiplier, the capacitance multiplier including:
a cascade of a plurality of current amplifiers, each current amplifier having a respective current gain Ki; and
a capacitor coupled in parallel across the cascade of current amplifiers, the capacitor having a node coupled to the charge pump,
wherein a first terminal of the capacitor is coupled to a first drain-to-source current path of a first current amplifier of the cascade of current amplifiers,
and wherein a second terminal of the capacitor is coupled to a second drain-to-source current path of a last current amplifier of the cascade of current amplifiers.

16. The phase locked loop of claim 15, wherein each current amplifier is comprised of a current mirror transistor pair having a size ratio of 1:Ki, and wherein the first terminal of the capacitor is coupled to a first source terminal of a first field effect transistor of the first current amplifier, and wherein the second terminal of the capacitor is coupled to a second source terminal of a second field effect transistor of the last current amplifier.

17. The phase locked loop of claim 15, wherein each current amplifier is comprised of transistors coupled as a plurality of inverters.

18. The phase locked loop of claim 15, wherein each current amplifier is comprised of a plurality of cascoded transistors.

19. The phase locked loop of claim 15, wherein a capacitance gain of the capacitance multiplier is substantially a product of the respective current gains of the current amplifiers.

20. The phase locked loop of claim 15, wherein a total current dissipation of the capacitance multiplier is substantially a sum of currents flowing through each branch in the current amplifiers.

* * * * *